United States Patent
Graesslin et al.

(10) Patent No.: US 7,701,213 B2
(45) Date of Patent: Apr. 20, 2010

(54) METHOD AND CIRCUIT ARRANGEMENT FOR OPERATING MULTI-CHANNEL TRANSMIT/RECEIVE ANTENNA DEVICES

(75) Inventors: Ingmar Graesslin, Boenningstedt (DE); Peter Vernickel, Hamburg (DE); Joachim Schmidt, Hamburg (DE); Christian Findeklee, Norderstedt (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/912,683

(22) PCT Filed: Apr. 21, 2006

(86) PCT No.: PCT/IB2006/051251

§ 371 (c)(1),
(2), (4) Date: Oct. 26, 2007

(87) PCT Pub. No.: WO2006/114749

PCT Pub. Date: Nov. 2, 2006

(65) Prior Publication Data

US 2008/0211501 A1 Sep. 4, 2008

(30) Foreign Application Priority Data

Apr. 28, 2005 (EP) .................... 05103520

(51) Int. Cl.
*G01V 3/00* (2006.01)
(52) U.S. Cl. ................................ 324/318; 324/309
(58) Field of Classification Search ......... 324/300–322; 600/410–435; 333/219–235; 343/720, 725–730, 343/741–752, 767–771, 787–823, 824–831, 343/866–873, 876–893, 895–906, 700 MS
See application file for complete search history.

(56) References Cited

U.S. PATENT DOCUMENTS

| | | | |
|---|---|---|---|
| 4,682,112 A | 7/1987 | Beer | |
| 5,280,246 A * | 1/1994 | Takahashi et al. | 324/322 |
| 6,400,318 B1 * | 6/2002 | Kasami et al. | 342/383 |
| 6,404,386 B1 * | 6/2002 | Proctor et al. | 342/368 |
| 6,526,310 B1 * | 2/2003 | Carter et al. | 600/509 |
| 6,650,118 B2 | 11/2003 | Leussler | |

(Continued)

FOREIGN PATENT DOCUMENTS

| | | |
|---|---|---|
| EP | 1314995 A | 5/2003 |
| FR | 2681432 A | 3/1993 |
| JP | 05237078 A | 9/1993 |
| WO | 2004061469 A1 | 7/2004 |

OTHER PUBLICATIONS

Boskamp, E. B., et al.; Whole body LPSA transieve array with optimized transmit homogeneity; 2002; Proc. Intl. Soc. Mag. Reson. Med.; 10.

Ibrahim, T. S., et al.; Effect of RF coil excitation on field inhomogeneity at ultra high fields: A field optimized TEM resonator; 2001; Magnetic Resonance Imaging; 19:1339-1347.

(Continued)

*Primary Examiner*—Brij B Shrivastav
*Assistant Examiner*—Dixomara Vargas

(57) ABSTRACT

A method and circuit arrangement for operating multi-channel transmit/receive antenna devices or arrangements is used in magnetic resonance imaging (MRI) systems. Full independent control of complete multi-channel RF transmit and receive chains can be conducted in a flexible way and new options like RF shimming, transmit sensitivity encoding (TransmitSENSE), RF encoding, determination of S- or Z-matrix prior to spin echo measurements, calibration, SAR (specific absorption rate) reduction etc. can be utilized or improved.

20 Claims, 1 Drawing Sheet

U.S. PATENT DOCUMENTS

Figure 1:
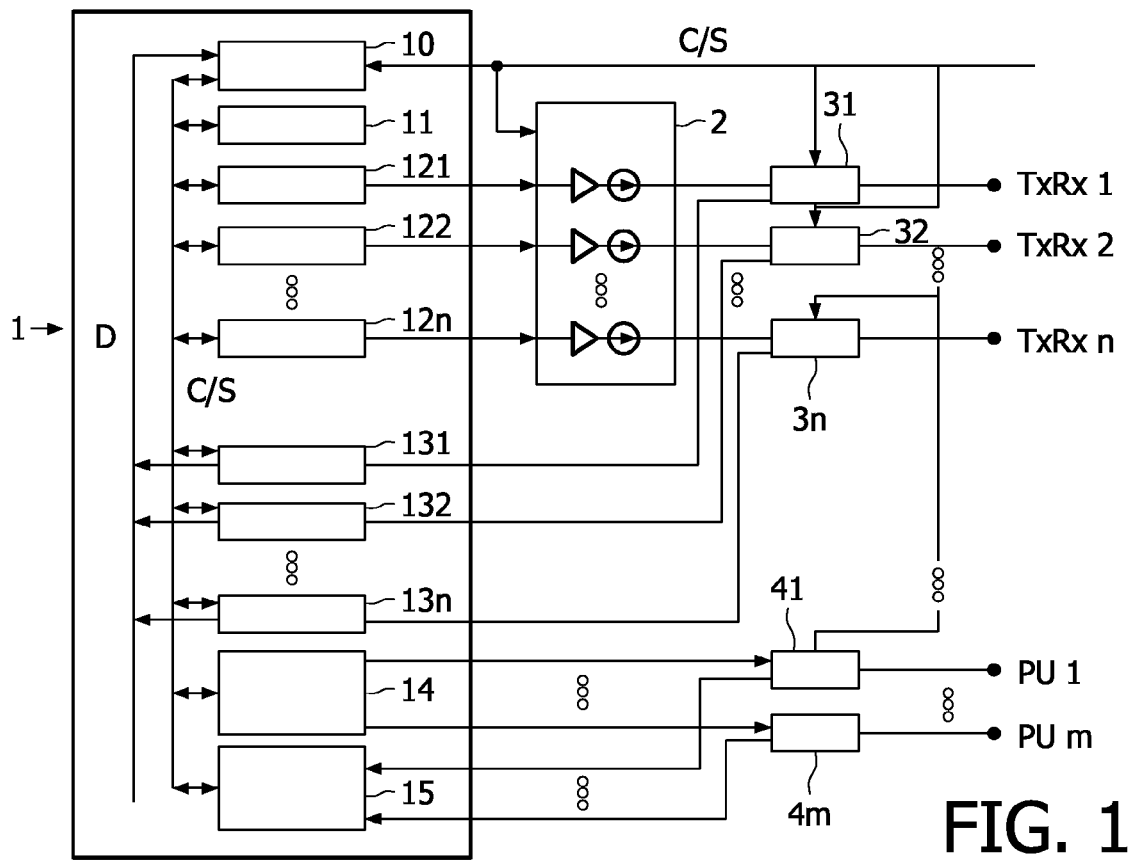

| | | | |
|---|---|---|---|
| 6,900,636 B2 * | 5/2005 | Leussler ..................... | 324/318 |
| 6,946,836 B2 * | 9/2005 | Kuhara ....................... | 324/307 |
| 6,969,992 B2 * | 11/2005 | Vaughan et al. ............ | 324/318 |
| 6,982,554 B2 * | 1/2006 | Kurpad et al. ............... | 324/318 |
| 6,995,561 B2 * | 2/2006 | Boskamp et al. ............ | 324/318 |
| 7,003,310 B1 * | 2/2006 | Youssefmir et al. ......... | 455/522 |
| 7,026,818 B2 * | 4/2006 | Machida et al. ............. | 324/322 |
| 7,091,721 B2 * | 8/2006 | Jevtic ......................... | 324/318 |
| 7,176,689 B2 * | 2/2007 | Machida et al. ............. | 324/318 |
| 7,183,770 B2 * | 2/2007 | Graβlin et al. .............. | 324/322 |
| 7,190,164 B2 * | 3/2007 | Kuhara ....................... | 324/309 |
| 7,205,937 B2 * | 4/2007 | Hein .......................... | 342/372 |
| 7,279,893 B1 * | 10/2007 | Marinelli et al. ............ | 324/307 |
| 7,336,076 B2 * | 2/2008 | Kuhara ....................... | 324/318 |
| 7,340,248 B2 * | 3/2008 | Kawasaki et al. ........... | 455/423 |
| 7,382,132 B1 * | 6/2008 | Mathew et al. .............. | 324/318 |
| 7,400,148 B2 * | 7/2008 | Adachi ....................... | 324/322 |
| 7,408,349 B1 * | 8/2008 | Hertz ......................... | 324/318 |
| 7,423,428 B2 * | 9/2008 | Kuhara ....................... | 324/307 |
| 7,449,886 B2 * | 11/2008 | Buchwald ................... | 324/311 |
| 2002/0093336 A1 | 7/2002 | Bernstein | |
| 2004/0150401 A1 | 8/2004 | Eberler et al. | |

OTHER PUBLICATIONS

Wright, S. M., et al.; Theory and application of array coils in MR spectroscopy; 1997; NMR in Biomedicine; 10:394-410.

Zhu, Y.; Parallel excitation with an array of transmit coils; 2004; Magnetic Resonance in Medicine; 51:775-784.

* cited by examiner

METHOD AND CIRCUIT ARRANGEMENT FOR OPERATING MULTI-CHANNEL TRANSMIT/RECEIVE ANTENNA DEVICES

The invention relates to a method and circuit arrangement for operating a multi-channel transmit/receive antenna device or arrangement especially for use in a magnetic resonance imaging (MRI) system.

EP 1 314 995 discloses RF antenna arrangements comprising a plurality of RF coils and/or coil segments. Each one of a plurality of transmitting units is assigned to each RF coil or coil segment and provided for independently adjusting the amplitude and/or the phase and/or the shape of pulses to be transmitted. Furthermore, each one of a plurality of receiving units is assigned to each RF coil or coil segment for individually being activated or deactivated. The decoupling between the coils/coil segments of such an antenna arrangement are adjusted by means of capacitive and/or inductive elements connected between the coils/coil segments, in order to correct or tune dielectric resonance effects and/or to obtain a desired pattern of the generated field strength and to control its homogeneity.

A general object underlying the invention is to provide a method and a circuit arrangement by which such a multi-channel transmit/receive antenna device or arrangement can be operated in a more efficient manner especially in case of a larger number of antenna elements, like coils and/or coil segments (coil elements or parts).

Furthermore, a method and a circuit arrangement shall be provided by which new options and possibilities of such a multi-channel transmit/receive antenna device like e.g. RF shimming, transmit sensitivity encoding (TransmitSENSE), RF encoding, determination of S- or Z-matrix prior to spin echo measurements, calibration, SAR (specific absorption rate) reduction etc. can be utilized or improved efficiently.

Furthermore, a method and a circuit arrangement shall be provided by which a calibration/recalibration of a multi-channel transmit/receive antenna device can be conducted in a simple and quick manner.

Furthermore, a method and a circuit arrangement shall be provided by which a field distribution can be determined and monitored in transmit and receive mode.

Finally, a method and a circuit arrangement shall be provided for operating a multi-channel transmit/receive antenna device of an MR system in such a way that system components and/or a patient is efficiently protected against too high electric field strengths especially when simultaneously activating or deactivating different transmit and/or receive channels of the antenna device.

The object is solved from the following description of the exemplary and preferred embodiments.

An advantage of this solution is that a transmit and/or a receive signal for each channel of the antenna device can independently and simultaneously be controlled or evaluated in a comparatively simple manner especially with respect to its amplitude and/or phase and/or frequency and/or waveform.

Furthermore, trip-levels can accurately and locally be monitored. New protection mechanisms for system components during simultaneous transmit and receive of different multi-channel elements can be realized.

Another advantage of this solution is the fact, that it is effectively applicable in magnetic resonance imaging systems applying known methods like Transmit SENSE or RF shimming for e.g. avoiding dielectric resonances in examination objects (and consequently inhomogeneous RF excitation fields) which otherwise could occur due to high or very high RF field strengths.

Figure 2:
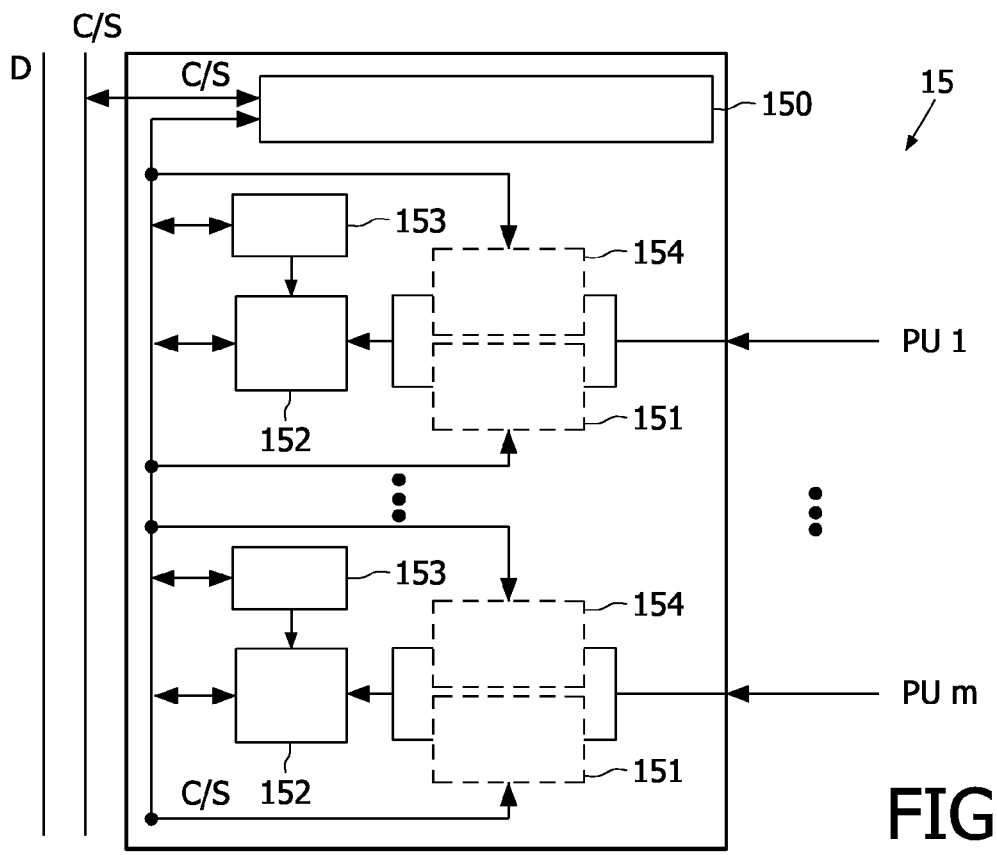

Further details, features, and advantages of the invention become obvious from the following description of exemplary and preferred embodiments of the invention with reference to the drawings in which shows:

FIG. 1 a schematic block diagram of a circuit arrangement according to a preferred embodiment of the invention, and FIG. 2 a more detailed block diagram of one component of the circuit arrangement according to FIG. 1.

Several multi-channel transmit/receive antenna devices or arrangements which can be operated by a method and circuit arrangement according to the invention are disclosed exemplarily in the above mentioned EP 1 314 995 which is made by reference to a part of this disclosure.

Such an antenna device is especially a RF coil arrangement comprising a plurality of RF coils and/or coil segments (or elements or parts) with different sizes and/or different positions which are each connected to a transmit/receive unit or channel of a circuit arrangement according to the invention.

FIG. 1 shows a schematic block diagram of a preferred embodiment of a circuit arrangement for operating a multi-channel transmit/receive antenna device, wherein the circuit arrangement is a part of a magnetic resonance imaging (MRI) system and especially of a related multi-channel data acquisition system. The circuit arrangement is exemplarily provided for operating a transmit/receive antenna arrangement comprising n coils (or coil segments) TxRx1, . . . TxRxn for generating a $B_1$ field and for receiving relaxation signals from an object to be examined.

Furthermore, a number m of pick-up coils PU1, . . . PUm is provided (wherein preferably m=n) for transmitting and receiving defined RF signals for e.g. calibration, monitoring and/or controlling purposes.

Alternatively, a first number of tune coils for transmitting defined RF signals and a second number of pick-up coils for receiving defined RF signals can be used, wherein the first and second number is preferably equal (e.g. m).

Substantial components of the circuit arrangement are preferably implemented in a spectrometer 1 in the form of one or more add-on circuit boards. These components are a central control or processor unit 10, a waveform control unit 11, a number n of transmit channels 121, . . . 12n, a number n of receive channels 131, . . . 13n, a tune-coil unit 14 and a pick-up coil detection unit 15, which are all connected to each other via a control-status bus C/S. Furthermore, the receive channels 131, . . . 13n and the central control or processor unit 10 are connected to each other via a data bus D.

The circuit arrangement further comprises a multi-channel RF amplifier 2 (or a number n of one-channel RF amplifiers), a number n of first transmit receive switches 31, . . . 3n, which are each connected with their input/output terminal to one coil or coil segment TxRx1, . . . TxRxn of the antenna device, and a number m of second transmit receive switches 41, . . . 4m, which are each connected with their input/output terminal to one pick-up coil PU1, . . . PUm.

In case of using tune coils for transmitting RF signals and pick-up coils for receiving RF signals, the second transmit receive switches 41, . . . 4m can be omitted.

The central control or processor unit 10 is connected with a control input of the RF amplifier 2 for controlling the same. Furthermore, the central control or processor unit 10 is connected with control inputs of the transmit receive switches 31, . . . 3n; 41, . . . 4m for independently switching these switches between transmit and receive mode.

The central control or processor unit 10 is provided for controlling the number n of transmit channels 121, ... 12n for independently adjusting the phases and/or amplitudes and/or frequencies of the generated RF signals, for controlling the number n of receive channels 131, ... 13n and for controlling the tune-coil unit 14 and the pick-up coil detection unit 15.

The waveform control unit 11 is provided for preferably independently adjusting the waveforms or pulse shapes of the RF signals generated by the transmit channels 121 ... 12n in dependence of a related control signal received from the central control or processor unit 10.

The outputs of the transmit channels 121, ... 12n are connected with inputs of the (multi-channel) RF amplifier 2. The outputs of the RF amplifier 2 are connected with the inputs of the first transmit receive switches 31, ... 3n, which are provided for supplying the amplified transmit RF signals to each one coil or coil segment of the antenna device when switched by the central control or processor unit 10 into the transmit mode.

The signals, which are received by the coils or coil segments (usually relaxation signals) are routed via the first transmit receive switches 31, ... 3n after switching them into the receive mode by the central control or processor unit 10, to each one of the receive channels 131, ... 13n for digitalization and further processing.

The transmit/receive modes of the first and second transmit receive switches 31, ... 3n; 41, ... 4m can be independently controlled by the central control or processor unit 10 so that for example some coils/coil segments and/or pick-up/tune coils transmit RF signals while other coils/coil segments or pick-up coils receive RF signals. Each of the first transmit receive switches 31, ... 3n must be capable to route RF signals having a peak power of some kW in order to excite nuclei spins. However, this power is much less than in usual conventional single channel systems.

The tune coil unit 14 comprises a number m of outputs, which are connected via the second transmit receive switches 41, ... 4m in transmit mode to each one pick-up coil for transmitting defined RF signals. The RF signals, which are received by these pick-up coils are routed via the transmit receive switches 41, ... 4m in the receive mode to each one input of the pick-up coil detection unit 15 for processing.

If tune coils are used for transmitting and pick-up coils are used for receiving, the second transmit receive switches 41, ... 4m can be omitted and the tune coils are connected with the tune coil unit 14 and the pick-up coils are connected with the pick-up coil detection unit 15.

The pick-up coil detection unit 15 is shown in more details in FIG. 2. It comprises a pick-up coil controller 150, which is controlled by the central control or processor unit 10 via the control-status bus C/S for controlling the processing of the signals, which are received by the pick-up coils.

For such a processing the pick-up coil detection unit 15 further comprises for each pick-up coil according to a first alternative an RF to DC converter 151 comprising a wide band logarithmic amplifier, and a trip level comparator 152, which are both controlled by the pick-up coil controller 150.

Furthermore, a storage 153 for a preset maximum trip level in the form of a DC voltage set by the spectrometer 1 or the pick-up coil controller 150 is provided. The trip levels can preferably be preset independently and with different values in each trip level storage 153 for each pick-up coil.

According to the first alternative, the received RF signals are converted to DC signals by means of the RF to DC converters 151. The DC signals are then routed to the related trip level comparators 152, which compare the DC voltages with a preset maximum trip level, which is stored in the storage 153 in the form of a DC voltage. If for example any of the DC voltages derived from all RF pick-up coil signals exceed the preset maximum trip level, a further transmission of RF signals can be inhibited by blanking the RF amplifiers 2 in order to avoid damage of system components.

Instead of processing the received RF signals in the analog domain, it can alternatively be carried out in the digital domain (second alternative). In this case, for each pick-up coil an analog-to-digital converter 154 is provided which is controlled by the pick-up coil controller 150 and which converts the DC signal into a digital signal which is compared in the trip level comparator 152 with the preset trip level as explained above.

According to a third alternative, an analog-to-digital converter 155 together with a demodulator can be used instead of the RF to DC converter 151 in order to convert the received RF signals to digital signals by means of the so-called direct conversion principle. The digital signals are each again fed into the trip level comparators 152 for comparing the same with preset trip levels as explained above.

The alternative to be chosen depends on certain boundary conditions as well as on the prices of chips available.

By this circuit arrangement a plurality of methods for operating a multi-channel transmit receive antenna device or arrangement can advantageously be conducted. These are in particular transmitting RF signals by means of at least one of the coils/coil segments of the antenna and receiving RF signals by the same or other of these coils/coil segments and/or by at least one of the pick-up coils. Another alternative is e.g. to transmit low power RF signals by means of at least one of the tune coils (or pick-up coil(s) if no tune coils are used) and receiving RF signals by at least one of the coils/coil segments of the antenna and/or by at least one of the pick-up coils.

This is especially due to the fact that the circuit arrangement allows an individual control of each RF transmit and receive signal including simultaneous transmit and receive by means of free selectable coils and/or coil segments of the RF antenna arrangement.

Correspondingly, individual local measurements of the RF field at each coil and/or coil segment can be conducted for various functions like e.g. for calibration purposes. The S-matrix can e.g. be determined by transmitting RF signals through individual coils or coil segments of the antenna arrangement and by receiving RF signals through other, non-transmitting coils or coil segments.

Furthermore, individual measurements of the multi-channel elements (especially of the coils and/or coil segments of the antenna arrangement) can be conducted by dedicated pick-up coils (or pairs of tune coils and pick-up coils). Such individual measurements can especially be provided for an accurate local and individual monitoring of trip levels, which can be preset independently for each pick-up coil. This might be advantageous for example if a symmetrical RF transmit receive coil is used in which, however, even for the same $B_1$ field not all pick-up coils have completely identical values of the received signals. Especially the current amplitudes for estimating the spatial $B_1$ field distribution in transmit and receive modes can be determined by the pick-up coils (or pairs of tune coils and pick-up coils).

By this, new methods for protecting other MRI system components against possible damage caused by RF fields ($B_1$ field) and/or for SAR reduction of an examination object especially during simultaneous RF transmission (and simultaneous reception) by means of different RF coils or coil segments of the antenna arrangement can be realized. If for example any of the measured local trip levels exceed related predefined trip levels, the RF amplifier 2 of the system can be blanked.

This is especially important, if not all channels are used in transmit or receive mode because in this case special care has to be taken not to destroy any electronic components in the receive path. By assigning individual local pick-up coils (or tune coils and pick-up coils) to each coil or coil segment (or each multi-channel element), any receive path can individually be protected.

This mode can e.g. also be used for the determination of S- or Z-matrices or for other calibration purposes in which the used transmit signals need to be very low. In this case, the trip levels will be set to comparatively small values and may be different for the channels in transmit or receive states.

Furthermore, the impedance of an individual coil and/or coil segment (or multi-channel element) can be determined. Preferably, a complete transmit/receive path for each pick-up coil (or each tune and pick up coil) is provided for this purpose.

Furthermore, multiple, independent RF paths for each coil and/or coil segment or each multi-channel element are provided. These paths can be configured individually for either transmission or reception of RF signals. As a consequence, it is possible to use one or more channels for RF transmission and one or more channels for RF reception, which especially in combination with a local monitoring of trip levels as explained above, opens up new options for measurements like e.g. the determination of S- or Z-matrices for individual patients.

The central control or processor unit 10 preferably comprises a related software by which the generation of the RF signals with respect to their amplitudes and/or phases and/or waveforms and/or frequencies by means of the transmit channels 121, ... 12n and the waveform control unit 11, respectively, the selection of the transmit channels 121, ... 12n, as well as the selection of the receive channels 131, ... 13n can be controlled. Furthermore, the trip levels and the selection of the pick-up coils (or the tune and pick-up coils) are set by the software as well. This applies also to the independent switching of the transmit receive switches 31, 32, ... 3n; 41, 42, ... 4m between transmit and receive modes.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A method for operating a multi-channel transmit/receive antenna device or arrangement comprising a plurality of RF antenna elements, comprising:
    controlling a plurality of transmit channels and/or receive channels which are each assigned to one of the RF antenna elements,
    selecting one or more of the RF antenna elements to transmit RF signals and/or one or more of the RF antenna elements to receive RF signals,
    controlling amplitudes and/or phases of the RF signals transmitted by the at least one transmitting RF antenna element individually and independently for each transmitting RF antenna element,
    wherein the selecting and/or controlling the RF antenna elements is conducted in dependence of at least one level of RF signals which are received by means of at least one receiving RF antenna element which is positioned within a RF field generated by the antenna device or arrangement, and
    transmitting the RF signals with RF antenna elements.

2. A computer readable medium which holds a computer program which controls a computer to perform the method according to claim 1.

3. The method according to claim 1, further including:
    comparing a level of the received RF signals with a predetermined trip level.

4. The method of according to claim 3, wherein transmission of RF signals is inhibited in response to the level of the received RF signals exceeding the predetermined trip level.

5. A circuit arrangement for operating a parallel imaging multi-channel transmit/receive antenna array including a plurality of RF antenna elements, circuit arrangement comprising:
    a control unit,
    a plurality of transmit channels which are each assigned to one of the antenna elements, and
    a plurality of receive channels which are each assigned to one of the antenna elements,
    wherein the control unit is configured to:
        select antenna elements of the antenna array for concurrently transmitting RF signals
        control each of the transmit channels to independently adjust amplitudes and phases of the RF signals of each transmit channel,
        convey the amplitude and phase adjusted RF signals to the selected elements to generate a $B_1$ field, and
        selects antenna elements of the antenna array to concurrently receive resonance signals induced by the $B_1$ field.

6. The circuit arrangement according to claim 5, further including:
    at least one pick-up/tune coil which is positionable within the $B_1$ field generated by the selected antenna elements of the antenna array to generate a pick-up/tune RF signal, the control unit being further configured to control the amplitude and/or phase of the transmit channels in accordance with characteristics of the pick-up/tune RF signals.

7. The circuit arrangement according to claim 6, comprising:
    a pick-up coil detection unit for processing and comparing the pick-up/tune signal with at least one trip level.

8. The circuit arrangement according to claim 7, wherein the control unit controls the RF transmit channels to inhibit transmission of RF signals when the received RF signal exceeds the predetermined trip level.

9. The circuit arrangement according to claim 6, wherein the levels of the received RF signal are measured individually and locally at the plurality of RF antenna elements.

10. The circuit arrangement according to claim 5, further comprising:
    a multichannel RF amplifier or a plurality of one channel RF amplifiers which are controlled by the control unit to individually and independently amplify the transmit signals in each transmit channel.

11. A magnetic resonance system, comprising:
    a plurality of RF antenna elements positioned around an examination region into which the $B_1$ field is transmitted and from which the resonance signals are received; and
    the circuit arrangement according to claim 5.

12. A magnetic resonance system for operating a multi-channel transmit/receive antenna device or arrangement, comprising:

a plurality of RF antenna elements which operate together to generate a common RF field;

a plurality of transmit channels which each generate a transmit RF signal with controllable amplitudes and phases;

a plurality of first transmit/receive switches which each connect one of the transmit channels with an RF antenna element;

a plurality of receive channels;

a plurality of second transmit/receive switches which connect each of the receive channels with an RF antenna element;

a control unit configured independently to:
control the transmit channels to control the amplitude and phase of the RF signals generated thereby,
control the first transmit/receive switches to select the RF elements which receive the RF signals and generate the RF field,
control the second transmit/receive switches to select which antenna elements provide received RF signals to the receive channels.

13. The magnetic resonance system according to claim 12, further including:
a detection unit configured to process the received RF signals and compare an amplitude of at least one of the received RF signals with a predetermined trip level, the control unit inhibiting the transmission of the transmit RF signals in response to the amplitude exceeding the predetermined trip level.

14. The magnetic resonance system according to claim 13, wherein the detection unit stores a predetermined maximum trip level in the form of a maximum DC voltage.

15. The magnetic resonance system according to claim 13, the control unit sets the trip levels independently for each of the RF receive channels.

16. The circuit arrangement according to claim 12, wherein the control unit controls the transmit receive switches to switch between a receive mode and a transmit mode.

17. The magnetic resonance system according to claim 12, wherein the control unit controls the transmit/receive switches such that some RF antenna elements transmit RF signals while some receive channels concurrently receive RF signals from other RF antenna elements.

18. The magnetic resonance system according to claim 12, further including:
a pick-up/tune coil configured to locally measure the RF field and generate a pick-up/tune RF signal,
a pick-up/tune coil detection unit which receives the pick-up/tune RF signal and compares an amplitude of the pick-up/tune RF signal with a threshold level.

19. The magnetic resonance system according to claim 18, wherein the control unit is connected to the pick-up/tune coil detection circuit and the control unit is configured to at least one of:
control the threshold level, and
control the transmit channels and/or amplifiers connected therewith to adjust an amplitude of at least some of the RF transmit signals.

20. The magnetic resonance system according to claim 12, wherein the control unit is connected to the receive channels and the control unit is further configured to adjust at least one of the amplitude and phase of the RF transmit signals in response to the received RF signals.

* * * * *